United States Patent
Iijima et al.

(10) Patent No.: US 9,048,251 B2
(45) Date of Patent: Jun. 2, 2015

(54) SEMICONDUCTOR DEVICE AND METHOD OF MANUFACTURING THE SAME

(71) Applicant: Kabushiki Kaisha Toshiba, Minato-ku (JP)

(72) Inventors: Ryosuke Iijima, Setagaya (JP); Yukio Nakabayashi, Yokohama (JP); Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/458,584

(22) Filed: Aug. 13, 2014

(65) Prior Publication Data

US 2015/0084067 A1 Mar. 26, 2015

(30) Foreign Application Priority Data

Sep. 20, 2013 (JP) .................................. 2013-195113

(51) Int. Cl.
| | |
|---|---|
| H01L 29/66 | (2006.01) |
| H01L 29/16 | (2006.01) |
| H01L 29/36 | (2006.01) |
| H01L 21/28 | (2006.01) |
| H01L 21/02 | (2006.01) |
| H01L 21/302 | (2006.01) |
| H01L 21/321 | (2006.01) |

(52) U.S. Cl.
CPC ...... H01L 29/66477 (2013.01); H01L 29/1608 (2013.01); H01L 29/36 (2013.01); H01L 21/28229 (2013.01); H01L 21/32105 (2013.01); H01L 21/02238 (2013.01); H01L 21/28255 (2013.01); H01L 21/302 (2013.01); H01L 29/66613 (2013.01); H01L 29/66621 (2013.01); H01L 29/66053 (2013.01); H01L 29/66068 (2013.01)

(58) Field of Classification Search
None
See application file for complete search history.

(56) References Cited

U.S. PATENT DOCUMENTS

| | | |
|---|---|---|
| 5,977,564 A | 11/1999 | Kobayashi et al. |
| 2009/0090919 A1* | 4/2009 | Uchida ........................... 257/77 |

FOREIGN PATENT DOCUMENTS

| | | |
|---|---|---|
| JP | 10-321854 | 12/1998 |
| JP | 3461274 | 10/2003 |
| JP | 2004-140067 | 5/2004 |
| JP | 2006-351743 | 12/2006 |
| JP | 2012-99630 | 5/2012 |

OTHER PUBLICATIONS

A. Pérez-Tomás, et al., "High doped MBE Si p-n and n-n heterojunction diodes on 4H-SiC", Microelectronics Journal, vol. 38, 2007, pp. 1233-1237.

* cited by examiner

Primary Examiner — Erik Kielin
(74) Attorney, Agent, or Firm — Oblon, McClelland, Maier & Neustadt, L.L.P.

(57) ABSTRACT

The semiconductor device of this embodiment includes: a first region of a first conductivity type SiC; a second region of a first conductivity type SiC, impurity concentration of first conductivity type of the second region being lower than impurity concentration of first conductivity type of the first region; a third region of a second conductivity type SiC provided between the first region and the second region; a Si layer provided on surfaces of the first, second, and third regions, a thickness of the Si layer on the third region being thicker than a thickness of the Si layer on the second region; a gate insulating film provided on the Si layer; and a date electrode provided on the gate insulating film.

9 Claims, 22 Drawing Sheets

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2013-195113, filed on Sep. 20, 2013, the entire contents of which are incorporated herein by reference.

FIELD

Embodiments described herein relate generally to a semiconductor device and a method of manufacturing the same

BACKGROUND

SiC (silicon carbide) is expected to be a material for next-generation power semiconductor devices. SiC has excellent physical properties, having a band gap three times wider than that of Si (silicon), a breakdown field strength approximately 10 times higher than that of Si, and a heat conductivity approximately three times higher than that of Si. By utilizing the physical properties a power semiconductor device that is low loss and can operate at a high temperature will be realized.

On the other hand, there is a problem in that a MOSFET or IGBT that uses SiC has a high on-resistance caused by the high channel resistance.

DETAILED DESCRIPTION

Figure 1:
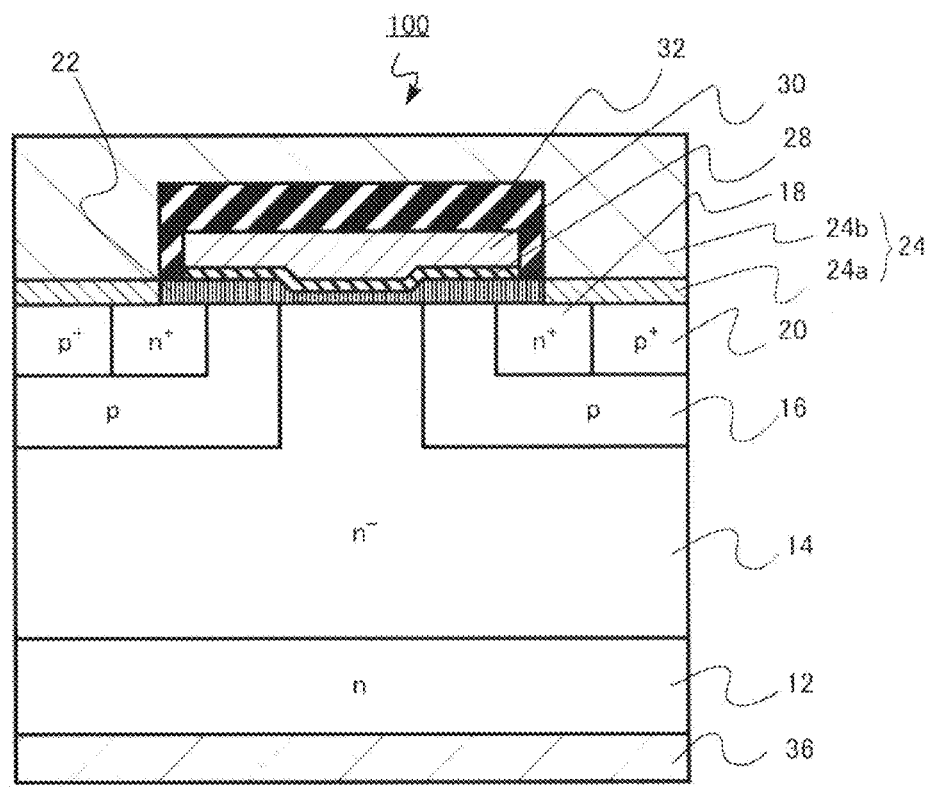
FIG. 1 is a schematic cross-sectional view of a semiconductor device of a first embodiment.

The semiconductor device of this embodiment includes: a first region of a first conductivity type SiC; a second region of a first conductivity type SiC, impurity concentration of first conductivity type of the second region being lower than impurity concentration of first conductivity type of the first region; a third region of a second conductivity type SiC provided between the first region and the second region; a Si layer provided on surfaces of the first, second, and third regions, a thickness of the Si layer on the third region being thicker than a thickness of the Si layer on the second region; a gate insulating film provided on the Si layer; and a gate electrode provided on the gate insulating film.

The following is a description of embodiments, with reference to the accompanying drawings. In the following description, like components are denoted by like reference numerals, and explanation of components described once will not be repeated.

Furthermore, in the description below, the signs $n^+$, $n$, and $n^-$ and the signs $p^+$, $p$, and $p^-$ denote the relative amount of the impurity concentration of each conductivity type. In other words, the $n^+$ means that the impurity concentration of the $n^-$ type is relatively higher than the $n$. The $n^-$ means that the impurity concentration of the n-type is relatively lower than the n. The $p^+$ means that the impurity concentration of the $p^-$ type is relatively higher than the p. The $p^-$ means that the impurity concentration of the p-type is relatively lower than the p. Note that the $n^+$ type or $n^-$ type is sometimes referred to merely as n type, and the $p^+$ type or $p^-$ type is sometimes referred to merely as p type.

First Embodiment

The semiconductor device of this embodiment includes: a first region that is a first conductivity type and that is made of SiC; a second region that is the first conductivity type of which impurity concentration is lower than that of the first region and that is made of SiC; a third region that is placed between the first region and the second region and that is a second conductivity type and that is made of SiC; a silicon (Si) layer that is continuously provided on the surfaces of the first, second, and third regions and of which thickness on the third region is thicker than that on the second region; a gate insulating film that is provided on the Si layer; and a gate electrode that is provided on the gate insulating film.

FIG. 1 is a schematic cross-sectional view of the structure of a MOSFET that is a semiconductor device of this embodiment. The MOSFET (Metal Oxide Semiconductor Field Effect Transistor) 100 is a Double Implantation MOSFET (DIMOSFET) of which p channel region and source region are formed by ion implantation.

The first conductivity type of the MOSFET 100 is n type and the second conductivity type is p type. The MOSFET 100 is an n channel type transistor in which an electron is the carrier. The MOSFET 100 is also a vertical transistor in which the carrier flows between a source electrode on the front surface of the semiconductor substrate and a drain electrode on the back surface.

This MOSFET 100 includes a SiC substrate (a silicon carbide substrate) 12 having first and second faces. In FIG. 1, the first face is the upper face, and the second face is the lower face. The SiC substrate 12 is a 4H—SiC substrate (n substrate) that includes, for example, nitrogen (N) as the n-type impurity of which impurity concentration is, for example, equal to or more than $1 \times 10^{18}$ cm$^{-3}$ and equal to or less than $1 \times 10^{19}$ cm$^{-3}$.

The first face is, for example, a Si surface or, namely, a face (0001). The first face can be offset relative to the Si face, for example, at an angle of 0.5 to 8 degrees. The first face can be a C surface or, namely, a face (000-1).

For example, a drift region (the second region) 14 that is an n-type SiC layer having the n-type impurity of which impurity concentration is equal to or more than $5 \times 10^{15}$ and equal to or less than $2 \times 10^{16}$ cm is formed on the first face of the SiC substrate 12. The drift region 14 has a thickness, for example, of about 5 to 20 μm.

A p channel region (the third region) 16 that is a p-type SiC region having the p-type impurity of which impurity concentration is, for example, equal to or more than $5 \times 10^{15}$ cm$^{-3}$ and equal to or less than $1 \times 10^{17}$ cm$^{-3}$ is formed on a part of the surface of the drift region 14. The p channel region 16 has a depth, for example, of about 0.6 μm. The p channel region 16 functions as a channel region of the MOSFET 100.

A source region (the first region) 18 that is an n$^+$-type SiC region having the n-type impurity of which impurity concentration is equal to or more than $1 \times 10^{18}$ cm$^{-3}$ and equal to or less than $1 \times 10^{22}$ cm$^{-3}$ is formed on a part of the surface of the p channel region 16. The depth of the source region 18 is shallower than that of the p channel region 16, and is, for example, about 0.3 μm. Furthermore, the n-type impurity concentration of the drift region 14 is lower than the n-type impurity concentration of the source region 18.

For example, a p channel contact region 20 that is a p$^+$-type SiC region, having the p-type impurity of which impurity concentration is, for example, equal to or more than $1 \times 10^{18}$ and equal to or less than $1 \times 10^{22}$ cm$^{-3}$ is formed on a part of the surface of the p channel region 16 and the side of the source region 18. The depth of the p channel contact region 20 is shallower than that of the p channel region 16, and is, for example, about 0.3 μm.

A Si (silicon) layer 22 is continuously provided on the surface of the n$^+$-type source region (the first region) 18, the surface of the n-type drift region (the second region) 14, and the surface of the p-type p channel region (the third region) 16. The Si layer 22 is, for example, a single-crystal layer or a poly-crystal layer.

Figure 2:
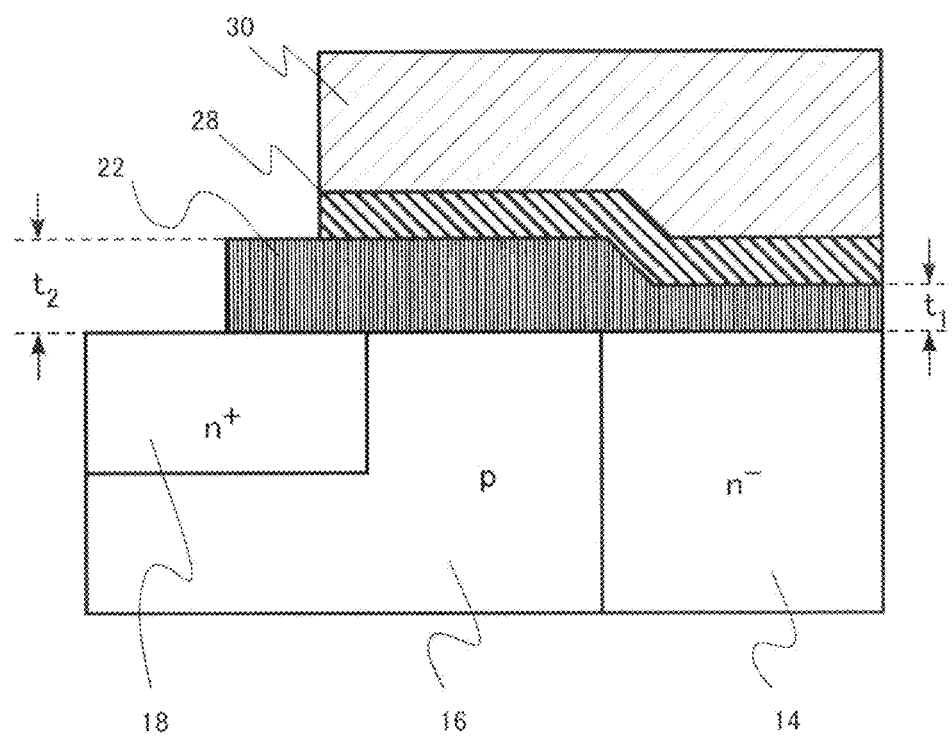
FIG. 2 is an enlarged schematic view of a neighborhood of the channel region of a semiconductor device of the first embodiment.

FIG. 2 is an enlarged schematic view of the neighborhood of the channel region of the semiconductor device of this embodiment. The thickness ("$t_2$" in FIG. 2) of the Si layer 22 on the p channel region (the third region) 16 is thicker than the thickness ("$t_1$" in FIG. 2) on the drift region (the second region) 14.

In that case, the fact that the thickness ($t_2$) of the Si layer 22 on the p channel region 16 is thicker than the thickness ($t_1$) of the Si layer 22 on the drift region 14 means that the maximum value of the thickness ($t_2$) is larger than the minimum value of the thickness ($t_1$). In other words, the Si layer 22 does not have a uniform thickness, and has a thin region at least on the drift region 14.

Then, a gate insulating film 28 is formed on the Si layer 22. The gate insulating film 28 is, for example, a silicon oxide film. Furthermore, a gate electrode 30 is formed on the gate insulating film 28. The gate electrode 30 is made of polysilicon, for example.

An interlayer insulator film 32 that is formed, for example, with a SiO$_2$ film is formed on the gate electrode 30. The p channel region (the third region) 16 that is placed between the source region (the first region) 18 and the drift region (the second region) 14 under the gate electrode functions as a channel region of the MOSFET 100.

The MOSFET includes a conductive first electrode (source/p-well common electrode) 24 that is electrically connected to the source region 18 and the p channel contact region 20. The first electrode (the source/p-well common electrode) 24 is formed with a Ni (nickel) barrier metal layer 24$a$ and an Al metal layer 24$b$ formed on the barrier metal layer 24$a$, for example. The Ni barrier metal layer 24$a$ and the Al metal layer 24$b$ may form an alloy through a reaction.

A conductive second electrode (a drain electrode) 36 is formed on the side of the second face of the SiC substrate 12. The second electrode (the drain electrode) 36 is made of Ni, for example.

In this embodiment, the n-type impurity is preferably N (nitrogen) or P (phosphorus), for example, but it is possible to use As (arsenic) or the like. Also, the p-type impurity is preferably Al (aluminum), for example, but it is possible to use B (boron), Ga (gallium), In (indium), or the like.

In the following, the function and effects of this embodiment are described in detail. FIGS. 3 through 9 are explanatory views of the function and effect of this embodiment.

Figure 3:
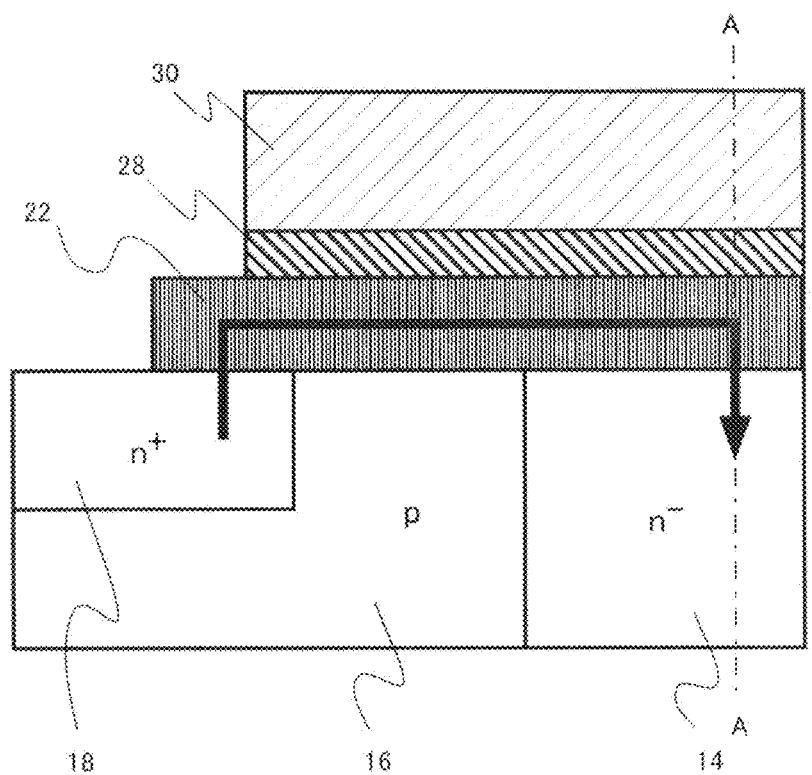
FIG. 3 is an explanatory view of the function and effect of the first embodiment.

Differently from the present embodiment, FIG. 3 is an enlarged schematic view of the neighborhood of the channel region of a MOSFET of which Si layer 22 has a uniform thickness. The arrow in FIG. 3 denotes a current pathway or, namely, a pathway on which the carrier flows. In that case, the Si layer is the channel on which the carrier flows.

The interface between the Si layer 22 and a gate insulating film 28, for example, a silicon oxide film is more readily formed as a high-quality interface in comparison with the interface between SiC and a gate insulating film. Thus, providing the Si layer 22 between the SiC and the gate insulating film 28 prevents the mobility at the semiconductor/insulator film interface from decreasing. This can realize a low channel resistance. For example, when the channel is made of SiC, the mobility is equal to or less than 100 cm$^2$/Vs. When the channel is made of Si, it is expected that the mobility is equal to or more than 300 cm$^2$/Vs.

However, providing the Si layer 22 can cause the existence of the Si/SiC interface between the Si layer 22 and the drift region 14 to be a problem when electrons flow from the Si layer 22 to the drift region 14.

Figure 4:
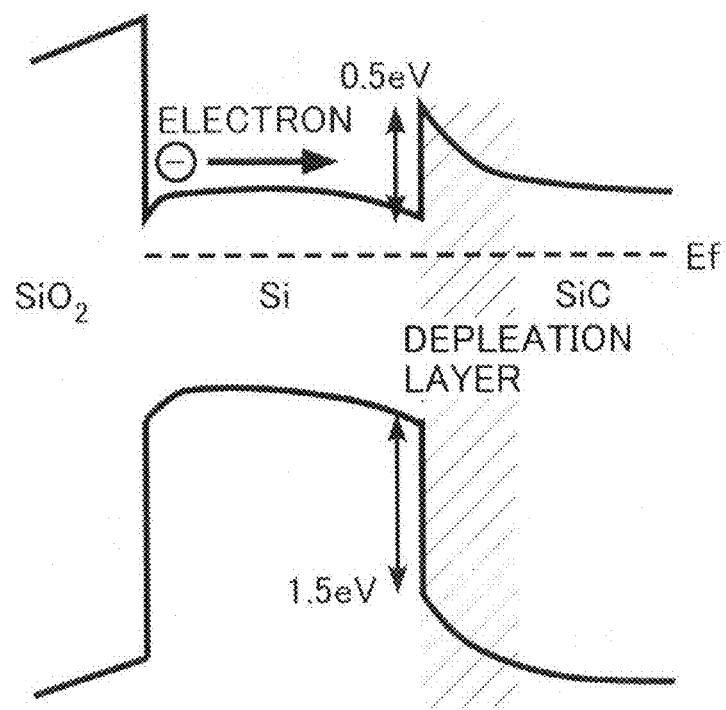
FIG. 4 is an explanatory view of the function and effect of the first embodiment.

FIG. 4 is a cross-sectional view of the band structure taken along line AA in FIG. 3. As illustrated in FIG. 4, there is an energy barrier of 0.5 eV at the Si/SiC interface. Furthermore, there is a depletion layer on the SiC side of the Si/SiC interface. This suppresses the flow of electrons from the Si layer 22 to the drift region 14. There is a risk that the on-resistance of the MOSFET increases.

Figure 5:
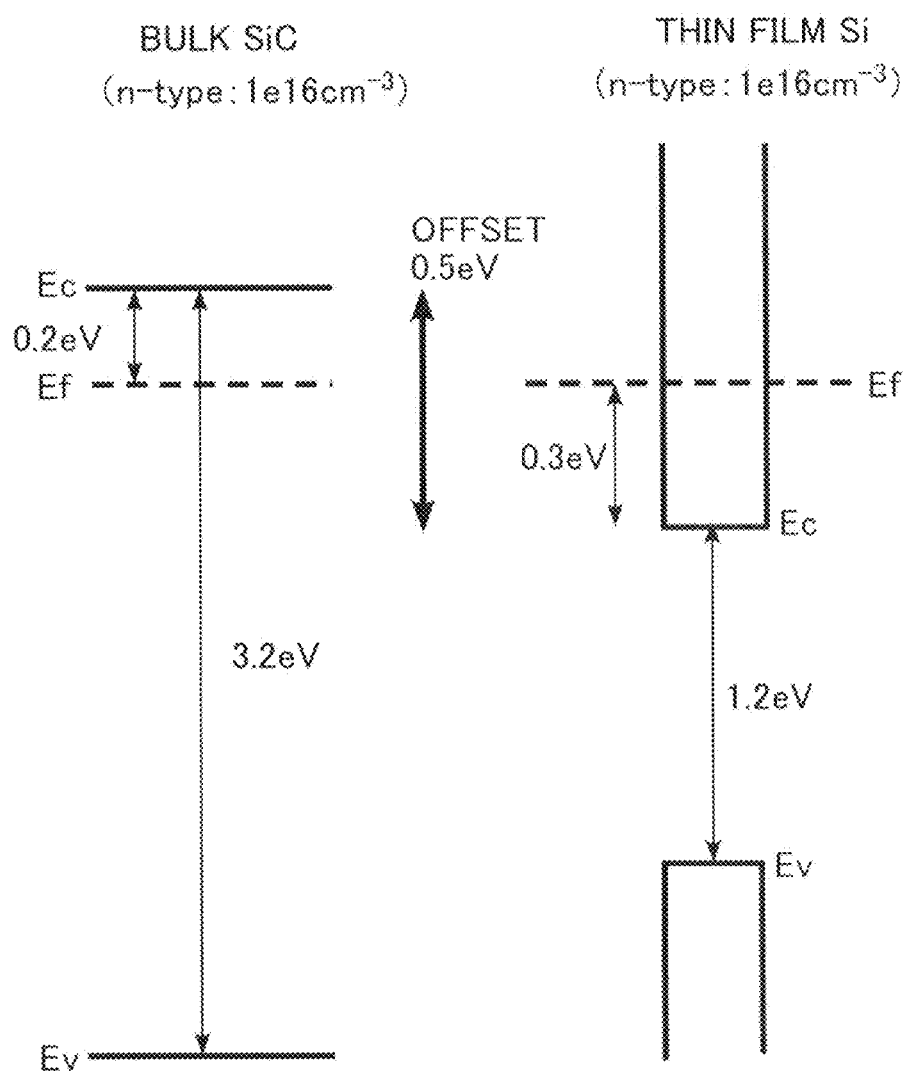
FIG. 5 is an explanatory view of the function and effect of the first embodiment.

FIG. 5 is a view of the function when the Si layer 22 is made thinner. FIG. 5 illustrates the band structure of a bulk SiC and a thin film Si. It is assumed that both of the bulk SiC and the thin film Si have an n-type impurity of which concentration is $1 \times 10^{16}$ cm$^{-3}$.

The confinement effect caused by thinning the Si increases the Fermi level (Ef) of the Si. If the Fermi level (Ef) of the Si can be increased to the Fermi level (Ef) of the SiC, the depletion layer of the Si/SiC interface disappears. It is expected that the electrons flow easily from the Si layer 22 toward the drift region 14.

Figure 6:
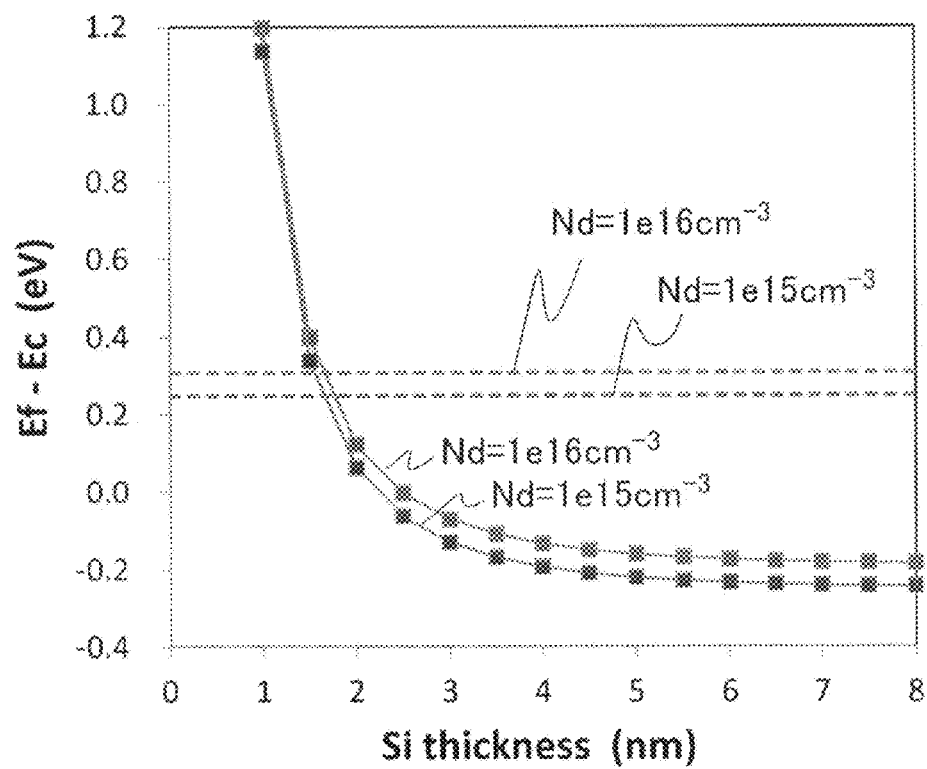
FIG. 6 is an explanatory view of the function and effect of the first embodiment.

FIG. 6 is a view of the thickness of the Si layer 22 and the variation in the Fermi level. The thickness of the Si layer 22 is shown on the horizontal axis. The difference between the Fermi level of the Si and the energy (Ec) at the lower edge of a conduction band is shown on the vertical axis. The degree of increase in the Fermi level caused by the thinning is shown on the vertical axis. The drawing illustrates the case the n-type impurity concentration is $1 \times 10^{1}$ cm$^{-3}$ and the case the n-type impurity concentration is $1 \times 10^{16}$ cm$^{-3}$.

In FIG. 6, the dashed lines show the desired values of the degree of increase in the Fermi level. Specifically, the dashed lines show the desired values of the differences between the Fermi level of the SiC and the energy (Ec) at the lower edge of the conduction band of the Si. The achievement of the desired value means that the Fermi level (Ef) of the Si corresponds to the Fermi level (Ef) of the SiC.

As clearly illustrated in FIG. 6, when the thickness of the Si layer 22 becomes equal to or less than 2 nm, the Fermi level (Ef) of the Si corresponds to the Fermi level (Ef) of the SiC. In view of the reduction in the on-resistance at the Si/SiC interface, a part having a thickness of 2 nm or less preferably exists in the Si layer 22 on the drift region (the second region) 14.

In this embodiment, thinning the Si layer 22 reduces the resistance at the Si/SiC interface. This can reduce the on-resistance. However, thinning the Si layer 22 increases the channel resistance. There is a risk that the on-resistance of the MOSFET increases.

Figure 7:
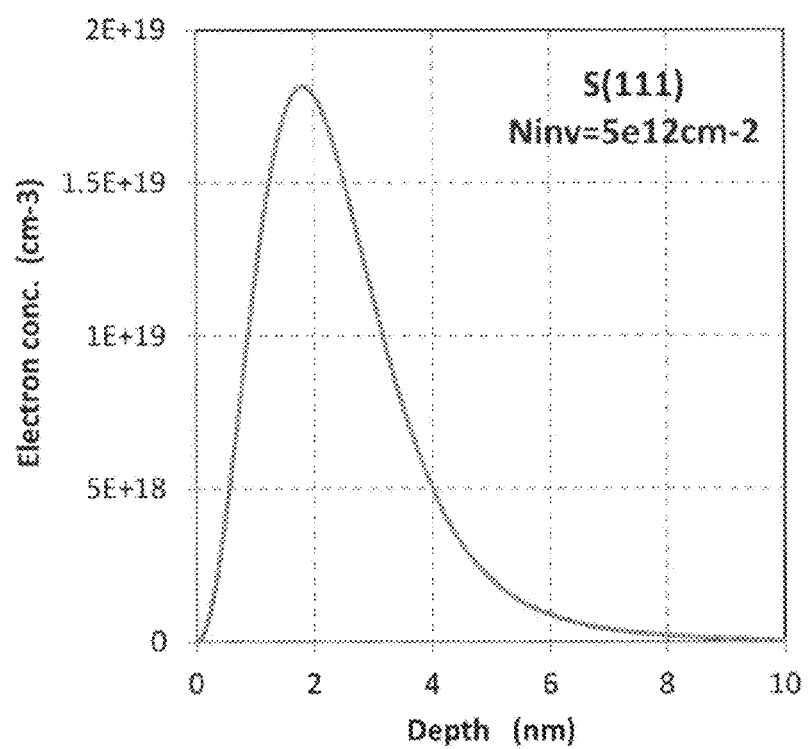
FIG. 7 is an explanatory view of the function and effect of the first embodiment.

FIG. 7 is a view of the depth dependence of the electron density when an inversion layer is formed in the Si layer. It is assumed the Si on a surface (111) has the electron having the area density of $5 \times 10^{12}$ cm$^{-2}$. Note that the calculation is performed on the assumption that a Si/SiC heterosurface is not included.

As clearly illustrated in FIG. 7, the electron density reaches the peak near a depth of 2 μm from the interface between the gate insulating film 28 and the Si layer. There is an inflection point at a depth of around 5 nm and the electron density becomes almost zero at a depth of 10 nm.

Figure 8:
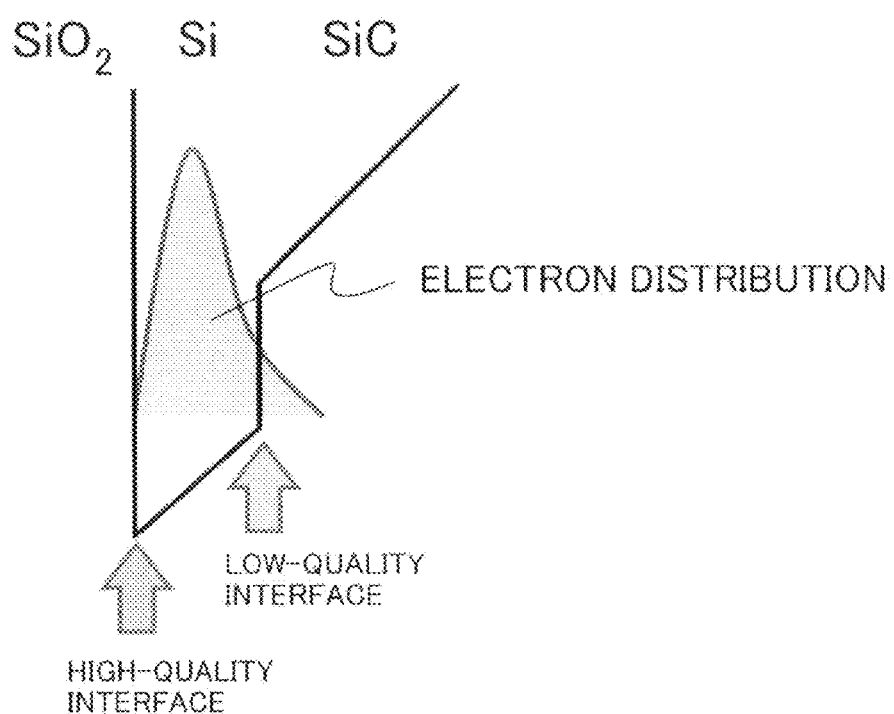
FIG. 8 is an explanatory view of the function and effect of the first embodiment.

FIG. 8 is an explanatory view of the electron distribution and the band structure when a Si/SiC heterointerface exists. When the thickness of the Si layer 22 is too thin, the movement of the electrons is affected by the low-quality Si/SiC interface and thus the mobility is reduced. There is a risk that the channel resistance increases.

In view of the avoidance of the effect of the Si/SiC interface, the Si layer 22 preferably has a thickness of 5 nm or more, and more preferably has a thickness of 10 nm or more on the p channel region (the third region) 16.

If the Si/SiC interface is at the shallow part of the channel region, the interface inhibits the band bending in a strong inversion state. There is a risk that a sufficient number of electrons are not induced to the inversion layer.

Figure 9:
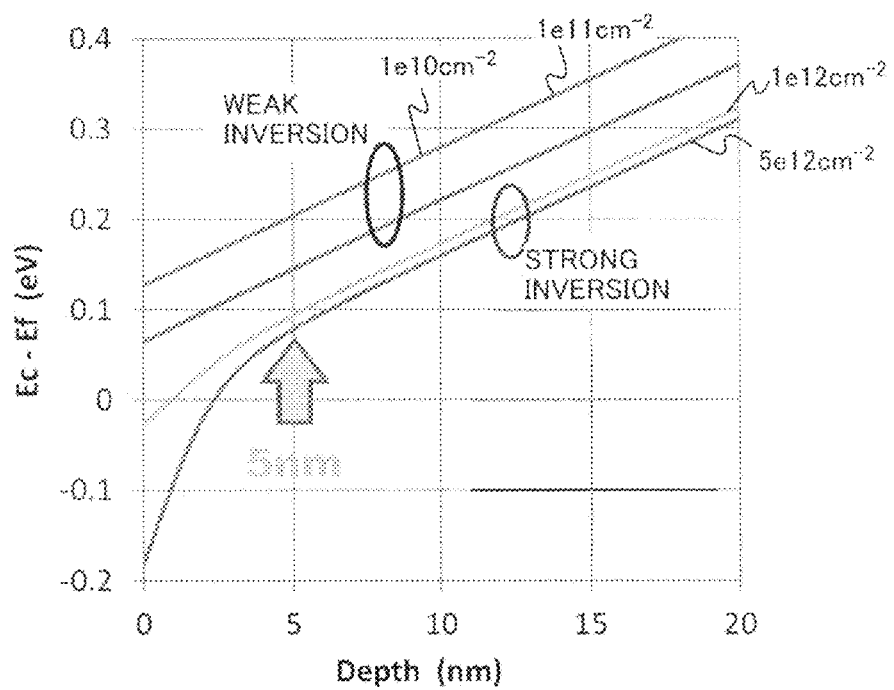
FIG. 9 is an explanatory view of the function and effect of the first embodiment.

FIG. 9 is a view of the depth dependence of the potential on the surface of the Si layer 22. The depth dependence is calculated while the electron area density of the inversion layer is changed from $1 \times 10^{10}$ cm$^{-2}$ to $5 \times 10^{12}$ cm$^{-2}$. Note that the calculation is performed on the assumption that a Si/SiC heterosurface is not included.

As clearly illustrated in FIG. 9, it is found that the potential at a depth of 5 nm or more from the interface with the gate insulating film 28 does not shift in a strong inversion state. Thus, when the Si layer 22 has a thickness of 5 nm or more, it is expected that the band vending is not affected by the low-quality Si/SiC interface and thus a sufficient electron density can be obtained. In view of the increase in the electron density and the reduction in the channel resistance, the Si layer 22 preferably has a thickness of 5 nm or more on the p channel region (the third region) 16.

Furthermore, the Si layer 22 preferably has a thickness of 100 nm or less on the p channel region (the third region) 16. It is because the depletion layer that is formed in the p channel region (the third region) 16 has a thickness of about 100 nm and there is a risk that the MOSFET is not operated when the Si layer 22 has a thickness exceeding 100 nm.

An inclined portion approaching the interface of the p channel region (the third region) 16 and the drift region (the second region) 14, and the Si layer 22 preferably exists on the interface between the Si layer 22 and the gate insulating film 28 in a direction from the p channel region (the third region) 16 toward the drift region (the second region) 14 as illustrated in FIGS. 1 and 2. It is because smoothly thinning the Si layer 22 in thickness prevents the channel resistance from increasing.

Furthermore, the Si layer 22 preferably has the maximum thickness at the boundary portion between the source region (the first region) 18 and the p channel region (the third region) 16. Reducing the channel resistance in the region is an efficient way to reduce the on-resistance of the MOSFET.

Furthermore, the Si layer 22 is preferably an i (intrinsic) type or an n type. This separates the position of the channel from the Si/gate insulating film interface and thus improves the mobility. Especially, the n type is me-re preferable.

Of this embodiment, the Si layer 22 is provided between the SiC and the gate insulating film 28. Then, using the Si layer 22 as a channel improves the mobility of the electrons. Furthermore, the Si layer 22 does not have a uniform thickness, but has a thin thickness in the drift region (the second region) 14 and has a thick thickness in the p channel region (the third region). This simultaneously achieves the reduction in the channel resistance and the reduction in the resistance on the Si/SiC interface. This realizes a low on-resistance MOSFET.

Next, a method of manufacturing the semiconductor device of this embodiment is described.

The method of manufacturing the semiconductor device of this embodiment includes: forming a Si layer continuously on the surface of a first region that is a first conductivity type and that is made of SiC, on the surface of a second region that is the first conductivity type of which impurity concentration is lower than that of the first region and that is made of SiC, and on the surface of a third region that is placed between the first region and the second region, that is a second conductivity type, and that is made of SiC; forming a mask material on the Si layer such that the surface of the Si layer is exposed on the second region; oxidizing the Si layer using the mask material as a mask; removing the mask material; forming the gate insulating film on the surface of the Si layer; and forming a gate electrode on the gate insulating film.

FIGS. 10 through 18 are schematic cross-sectional views illustrating the method of manufacturing the semiconductor device of this embodiment.

First, a low-resistance n-type 4H—SiC substrate 12 that includes phosphorus (P) or nitrogen (N) as an n-type impurity of which impurity concentration is about $5 \times 10^{18}$ cm$^{-3}$, and that has a thickness, for example, of 300 μm is prepared.

Next, using an epitaxial growth method, the epitaxial growth of a drift region (the second region) 14 is developed on the first face of the SiC substrate 12. The drift region 14 is a high-resistance n-type SiC layer that includes, for example, N as an n-type impurity of which impurity concentration is about $1 \times 10^{16}$ cm$^{-3}$, and that has a thickness of about 10 μm.

Figure 10:
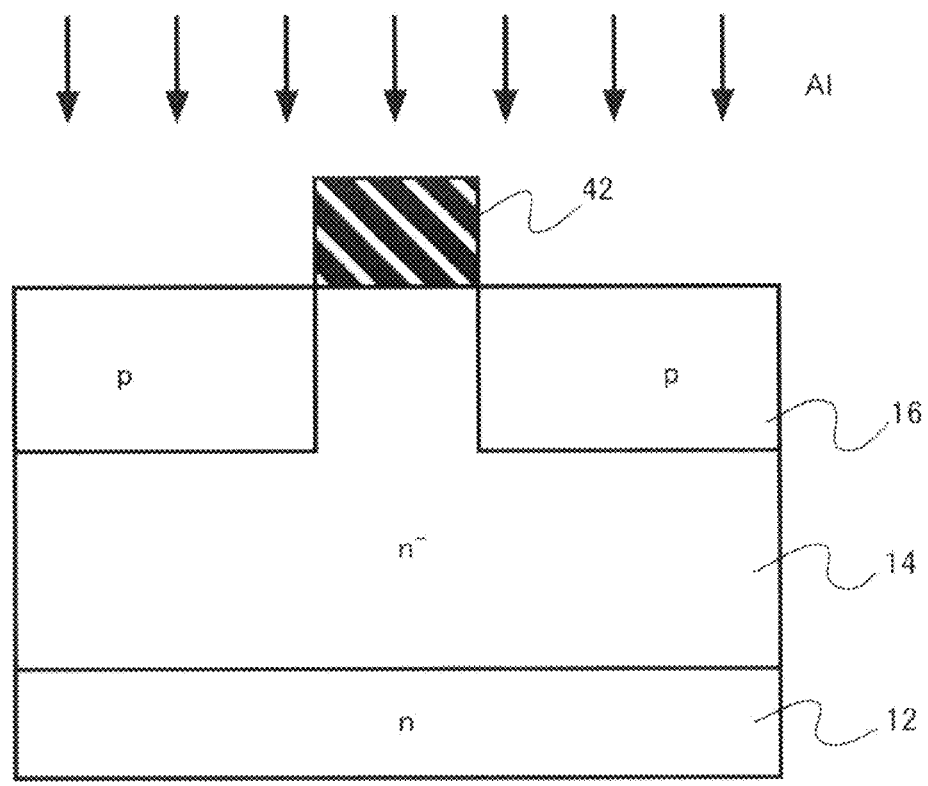
FIG. 10 is a schematic cross-sectional view illustrating the method of manufacturing the semiconductor device of the first embodiment.

After that, for example, a SiO$_2$ first mask material 42 is formed by a patterning with photolithography and etching. Using the first mask material 42 as an ion implantation mask, Al that is a p-type impurity is implanted in the drift region 14 with ion implantation to form a p channel region (the third region) 16 (FIG. 10).

Figure 11:
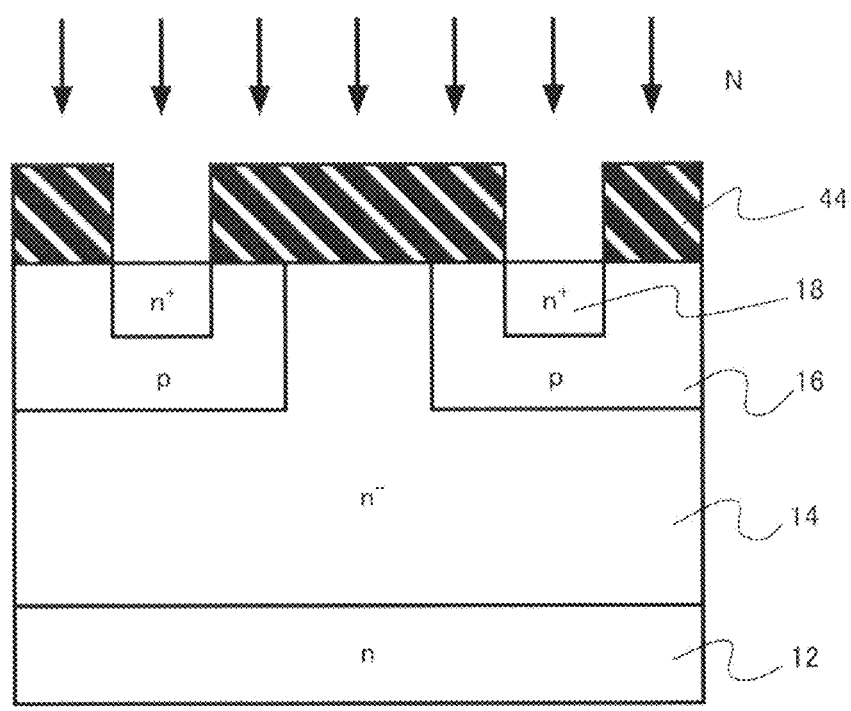
FIG. 11 is a schematic cross-sectional view illustrating the method of manufacturing the semiconductor device of the first embodiment.

After that, for example, a SiO$_2$ second mask material 44 is formed by a patterning with photolithography and etching. Using the second mask material 44 as an ion implantation mask, N that is an n-type impurity is implanted in the p channel region (the third region) 16 with ion implantation to form a source region (the first region) 18 (FIG. 11).

The n-type impurity concentration of the drift region (the second region) 14 is lower than the n-type impurity concentration of the source region (the first region) 18. Furthermore, the p-type p channel region (the third region) 16 is placed between the n-type source region (the first region) 18 and the n-type drift region (the second region) 14.

Figure 12:
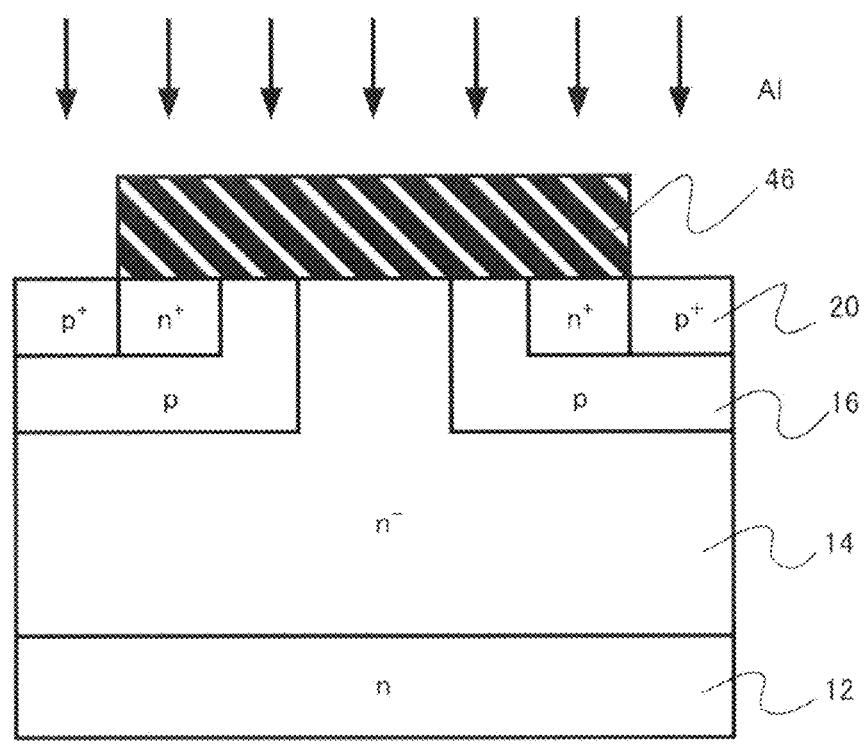
FIG. 12 is a schematic cross-sectional view illustrating the method of manufacturing the semiconductor device of the first embodiment.

After that, for example, a SiO$_2$ third mask material 46 is formed by a patterning with photolithography and etching. Using the third mask material 46 as an ion implantation mask, Al that is a p-type impurity is implanted in the p channel region (the third region) 16 with ion implantation to form a p channel contact region 20 (FIG. 12).

Next, an annealing treatment is performed to activate the p-type impurity and the n-type impurity. The annealing uses, for example, an argon (Ar) gas as an atmosphere gas, and uses a condition such as a heating temperature of 1600° C. or a heating time of 30 minutes. At this point, the impurities implanted into the SiC can be activated, but diffusion is small.

Figure 13:
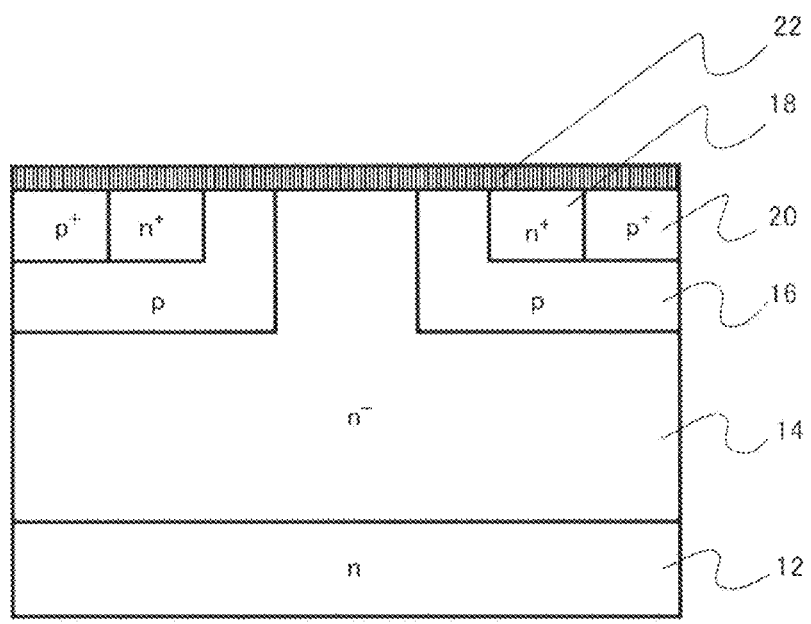
FIG. 13 is a schematic cross-sectional view illustrating the method of manufacturing the semiconductor device of the first embodiment.

Next, a Si layer 22 is formed continuously on the surface of the n-type source region (the first region) 18, on the surface of the n-type drift region (the second region) 14, on the surface of the p-type p channel region (the third region) 16 (FIG. 13).

The Si layer 22 is, for example, made of amorphous Si, and is formed, for example, with a Chemical Vapor Deposition (CVD) method. The amorphous Si layer 22 is converted, for example, into single-crystal Si or poly-crystal Si with an annealing treatment. Instead of amorphous Si, single-crystal Si or poly-crystal Si can directly be formed with a CVD method.

Figure 14:
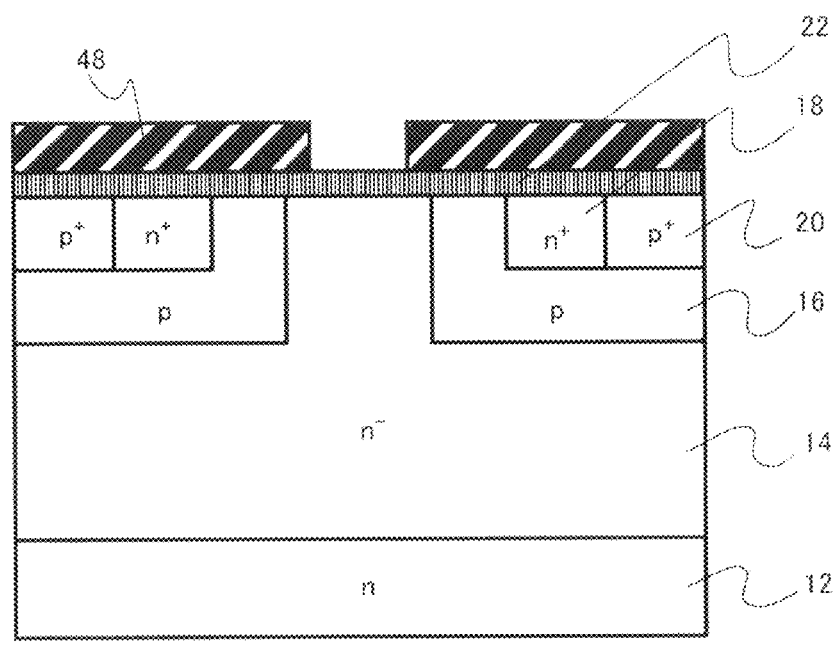
FIG. 14 is a schematic cross-sectional view illustrating the method of manufacturing the semiconductor device of the first embodiment.

Next, a mask material 48 is formed on the Si layer 22 such that a part of the surface of the Si layer 22 is exposed on the n-type drift region (the second region) 14 (FIG. 14). The mask material 48 is, for example, a silicon nitride film.

Figure 15:
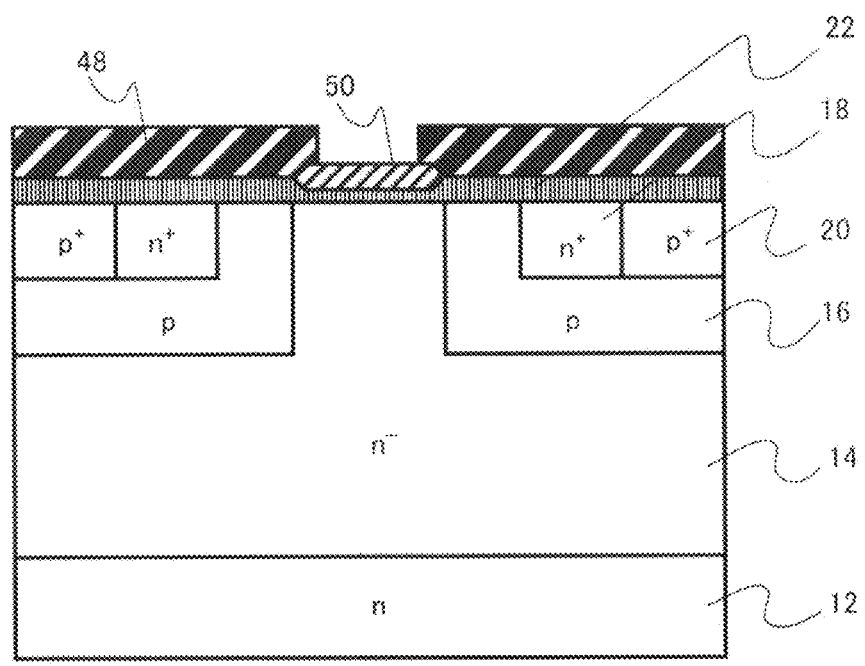
FIG. 15 is a schematic cross-sectional view illustrating the method of manufacturing the semiconductor device of the first embodiment.

Next, the Si layer 22 is selectively oxidized using the mask material 48 as a mask to form a silicon oxide film 50 (FIG. 15). This process is referred to as a Local Oxidation of Silicon (LOCOS) process. Oxidizing the Si layer 22 on the n-type drift region (the second region) 14 thins the Si layer 22 on the region selectively. A part having a thickness of 2 nm or less is preferably formed on the Si layer 22 on the n-type drift region (the second region) 14.

Note that when a part of the Si layer 22 is completely oxidized while the Si layer 22 is oxidized, a part of the silicon oxide film 50 can contact the drift region (the second region) 14.

Figure 16:
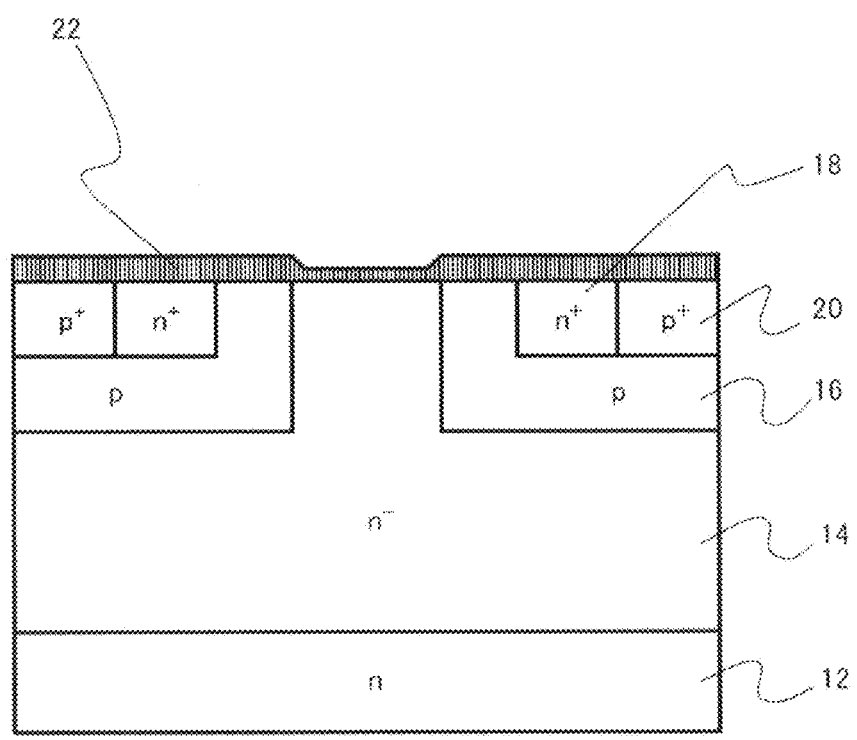
FIG. 16 is a schematic cross-sectional view illustrating the method of manufacturing the semiconductor device of the first embodiment.

Next, the silicon oxide film 50 is removed, for example, with wet etching in hydrofluoric acid (FIG. 16).

Note that the silicon oxide film 50 can be left without removing. In that case, a MOSFET that includes the gate insulating film 28 of which thickness is thicker on the n-type drift region (the second region) 14 than that on the p channel region (the third region) 16 is formed. This can prevent the gate leakage current when the MOSFET is turned off.

Figure 17:
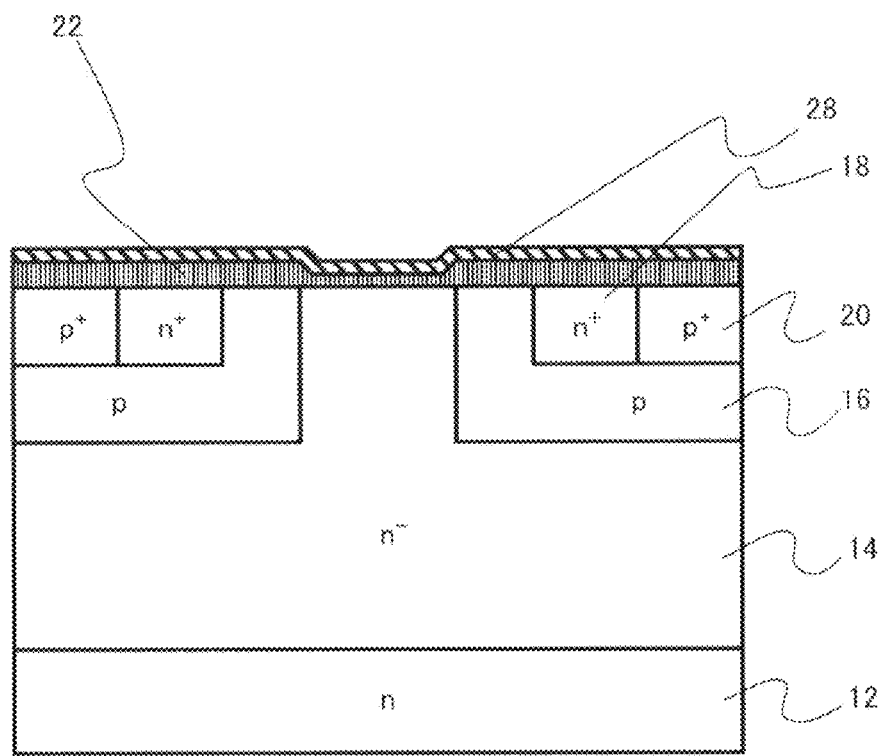
FIG. 17 is a schematic cross-sectional view illustrating the method of manufacturing the semiconductor device of the first embodiment.

Next, a gate insulating film 28 is formed on the surface of the Si layer 22 (FIG. 17). The gate insulating film 28 is, for example, a silicon oxide film formed with a CVD method.

Figure 18:
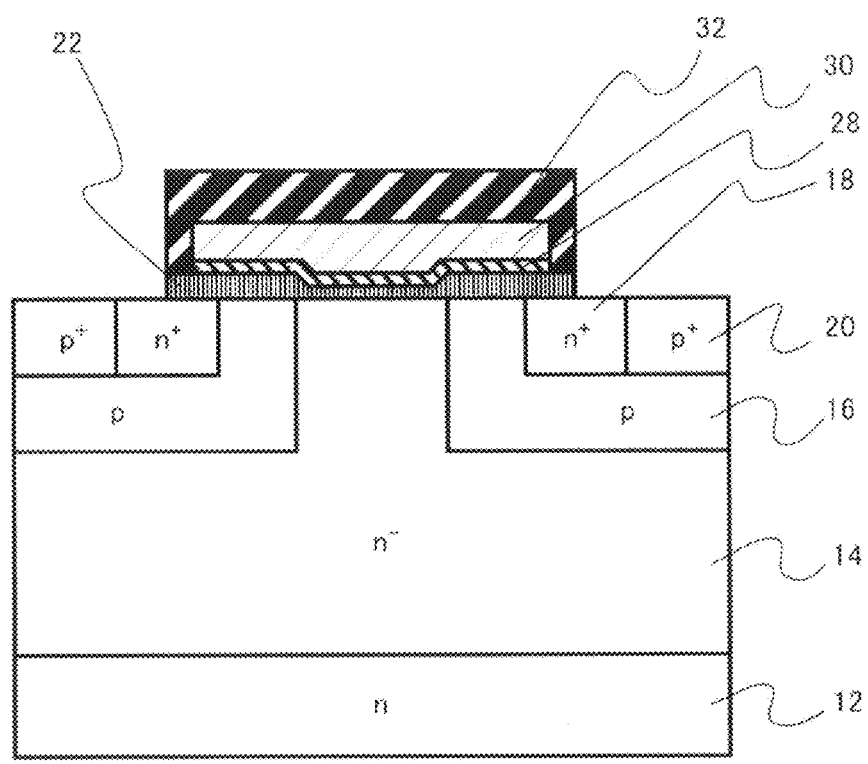
FIG. 18 is a schematic cross-sectional view illustrating the method of manufacturing the semiconductor device of the first embodiment.

Next, for example, a polysilicon gate electrode 30 is formed on the gate insulating film 28. Then, for example, an interlayer insulator film 32 that is a SiO$_2$ film is formed on the gate electrode 30 (FIG. 18).

After that, a conductive first electrode (source/p-well common electrode) 24 that is electrically connected to the source region 18 and the p channel contact region 20 is formed. The first electrode (the source/p-well common electrode) 24 is formed by Ni (nickel) and Al sputtering, for example. When the first electrode 24 is formed, the Si layer 22 can be removed in advance, for example, with etching. Alternatively, when the first electrode is formed by silicidation, the Si layer 22 can also be silicidated.

Next, a conductive second electrode (drain electrode) 36 is formed on the second face of the n$^-$ SiC substrate 12. The second electrode (the drain electrode) 36 is formed by Ni sputtering, for example.

After that, to reduce the contact resistance of the first electrode 24 and second electrode 36, an annealing treatment is performed at a low temperature. The annealing is performed, for example, in an argon gas atmosphere of 400° C.

By the above described manufacturing method, the MOSFET 100 shown in FIG. 1 is formed.

This embodiment realizes a MOSFET with a low on-resistance by optimizing the thickness of the Si layer 22 for each region.

Second Embodiment

Differently from the first embodiment, this embodiment is a trench type vertical transistor. The description of the contents that overlaps with the first embodiment will be omitted.

Figure 19:
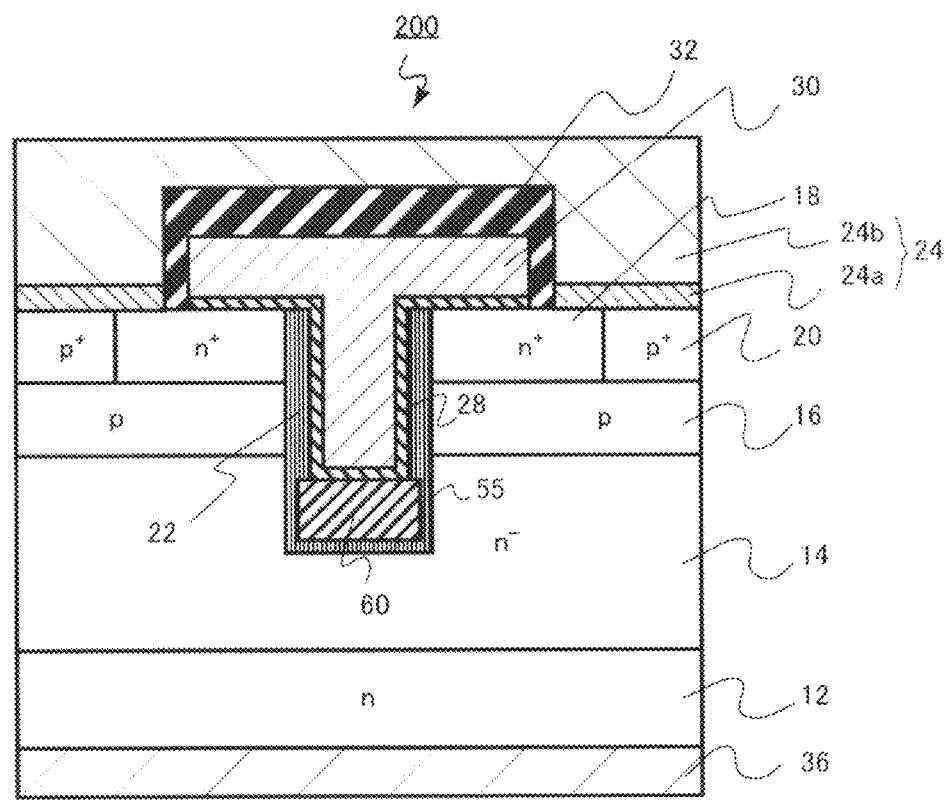
FIG. 19 is a schematic cross-sectional view of a semiconductor device of a second embodiment.

FIG. 19 is a schematic cross-sectional view of the structure of a MOSFET that is a semiconductor device of this embodiment. A MOSFET 200 is a trench-type vertical transistor in which a p channel region is formed on the side surface of a trench.

This MOSFET 200 includes a SiC substrate (a silicon carbide substrate) 12 having first and second faces. In FIG. 19, the first face is the upper face, and the second face is the lower face. The SiC substrate 12 is a 4H—SiC substrate (n substrate) including, for example, nitrogen (N) as an n-type impurity, for example, of which impurity concentration is equal to or more than $1 \times 10^{18}$ cm$^{-3}$ and equal to or less than $1 \times 10^{19}$ cm$^{-3}$.

The first face is, for example, a Si surface or, namely, a face (0001). The first face can be offset relative to the Si face, for example, at an angle of 0.5 to 8 degrees. The first face can be a C surface or, namely, a face (000-1).

A drift region (the second region) 14, for example, that is an n-type SiC layer including an n-type impurity of which impurity concentration is equal to or more than $5 \times 10^{15}$ and equal to or less than $2 \times 10^{16}$ cm$^{-3}$ is formed on a first face of the SiC substrate 12. The drift region 14 has a thickness, for example, of about 5 to 20 μm.

A p channel region (the third region) 16 that is a p-type SiC region including a p-type impurity, for example, of which impurity concentration is equal to or more than $5 \times 10^{15}$ cm$^{-3}$ and equal to or less than $1 \times 10^{17}$ cm$^{-3}$ is formed on the drift region 14. The p channel region 16 has a depth, for example, of about 0.6 μm. The p channel region 16 functions as a channel region of the MOSFET 200.

A source region (the first region) 18 including an n-type impurity, for example, of which impurity concentration is equal to or more than $1 \times 10^{18}$ cm$^{-3}$ and equal to or less than $1 \times 10^{22}$ cm$^{-3}$ is formed on a part of the surface of the p channel region 16. The depth of the source region 18 is shallower than that of the p channel region 16, and is, for example, about 0.3 μm. Furthermore, the n-type impurity concentration of the drift region 14 is lower than the n-type impurity concentration of the source region 16.

Furthermore, a p channel contact region 20 that is a p$^+$-type SiC region including a p-type impurity, for example, of which impurity concentration is equal to or more than $1 \times 10^{18}$ and equal to or less than $1 \times 10^{22}$ cm$^{-3}$ is formed on a part of the surface of the p channel region 16 and the side of the source region 18. The depth of the p channel contact region 20 is shallower than that of the p channel region 16, and is, for example, about 0.3 μm.

A trench 55 penetrating the source region (the first region) 18 and the p channel region (the third region) 16 and reaching the drift region (the second region) 14 is provided. A silicon (Si) layer 22 is provided continuously on the surface of the n$^+$-type source region (the first region) 18, on the surface of the n-type drift region (the second region) 14, and on the surface of the p-type p channel region (the third region) 16 and inside the trench 55. The Si layer 22 is, for example, a single-crystal layer or a poly-crystal layer.

The thickness of the Si layer 22 on the p channel region (the third region) 16 is thicker than the thickness on the drift region (the second region) 14.

In that case, the fact that the thickness of the Si layer 22 on the p channel region 16 is thicker than the thickness of the Si layer 22 on the drift region 14 means that the maximum value of the thickness is larger than the minimum value of the thickness. In other words, the Si layer 22 does not have a uniform thickness, and has a thin region at least on the drift region 14.

An buried oxide film 60 is provided on Si layer 22 at the bottom portion of the trench 55. The buried oxide film 60 reduces the concentration of the electric field at the bottom portion of the trench. This improves the reliability of the MOSFET 200.

Then, a gate insulating film 28 is formed on the Si layer 22. The gate insulating film 28 is, for example, a silicon oxide film. Furthermore, a gate electrode 30 is formed on the gate insulating film 28. The gate electrode 30 is made of polysilicon, for example.

An interlayer insulator film 32 that is formed, for example, with a SiO$_2$ film is formed on the gate electrode 30. The p channel region 16 placed between the source region 18 and the drift region 14 under the gate electrode functions as a channel region of the MOSFET 200.

The MOSFET includes a conductive first electrode (source/p-well common electrode) 24 that is electrically connected to the source region 18 and the p channel contact region 20. The first electrode (the source/p-well common electrode) 24 is formed with a Ni (nickel) barrier metal layer 24a and an Al metal layer 24b formed on the barrier metal layer 24a, for example. The Ni barrier metal layer 24a and the Al metal layer 24b may form an alloy through a reaction.

A conductive second electrode (a drain electrode) 36 is formed on the side of the second face of the SiC substrate 12. The second electrode (the drain electrode) 36 is made of Ni, for example.

Next, a method of manufacturing the semiconductor device of this embodiment is described.

FIGS. 20 through 25 are schematic cross-sectional views illustrating the method of manufacturing the semiconductor device of this embodiment.

First, a low-resistance n-type 4H—SiC substrate 12 that includes phosphorus (P) or nitrogen (N) as an n-type impurity of which impurity concentration is about $5 \times 10^{18}$ cm$^{-3}$, and that has a thickness, for example, of about 300 μm is prepared.

Next, using an epitaxial growth method, the epitaxial growth of a drift region (the second region) 14 is developed on the first face of the SiC substrate 12. The drift region 14 is a high-resistance n-type SiC layer that includes, for example, N as an n-type impurity of which impurity concentration is about $1 \times 10^{16}$ cm$^{-3}$, and that has a thickness of about 10 μm.

After that, Al that is a p-type impurity is implanted in the drift region 14 with ion implantation to form a p channel region (the third region) 16 that is a p-type SiC region.

After that, for example, a SiO$_2$ mask material is formed by a patterning with photolithography and etching. Using the mask material as an ion implantation mask, N that is an n-type impurity is implanted in the p channel region 16 with ion implantation to form a source region (the first region) 18 that is a nth-type SiC region.

The n-type impurity concentration of the drift region (the second region) 14 is lower than the n-type impurity concentration of the source region (the first region) 18. Furthermore, the p-type p channel region (the third region) 16 is placed between the n-type source region (the first region) 18 and the n-type drift region (the second region) 14.

Figure 20:
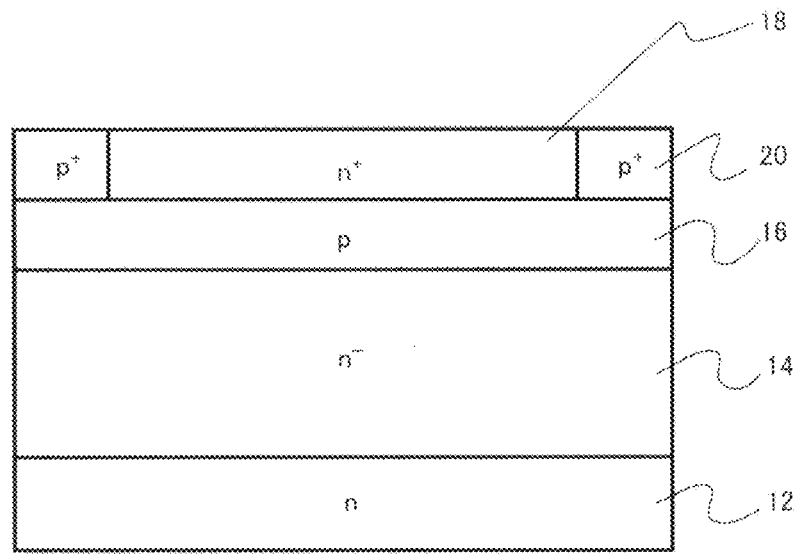
FIG. 20 is a schematic cross-sectional view illustrating the method of manufacturing the semiconductor device of the second embodiment.

After that, for example, a SiO$_2$ mask material is formed by a patterning with photolithography and etching. Using the mask material as an ion implantation mask, Al that is a p-type impurity is implanted in the p channel region (the third region) 16 with ion implantation to form a p channel contact region 20 (FIG. 20).

Next, an annealing treatment is performed to activate the p-type impurity and the n-type impurity. The annealing uses, for example, an argon (Ar) gas as an atmosphere gas, and uses a condition such as a heating temperature of 1600° C. or a heating time of 30 minutes. At this point, the impurities implanted into the SiC can be activated, but diffusion is small.

Figure 21:
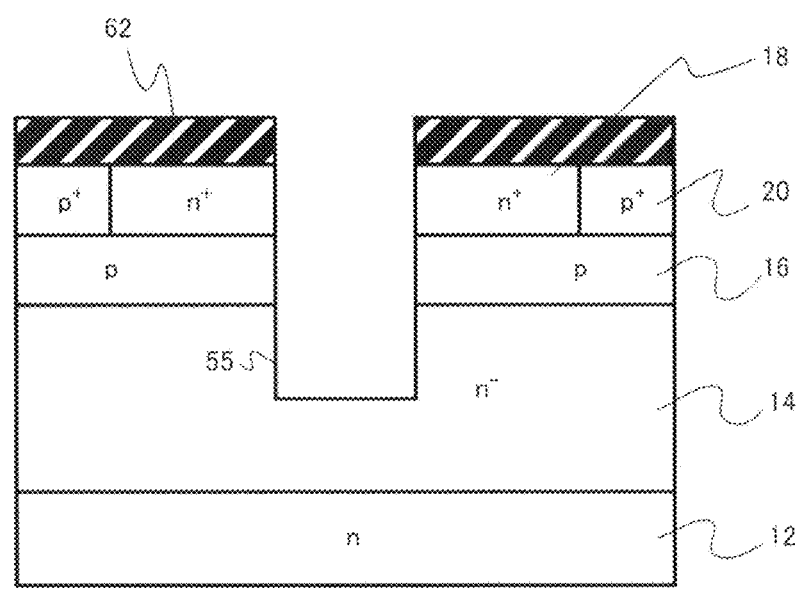
FIG. 21 is a schematic cross-sectional view illustrating the method of manufacturing the semiconductor device of the second embodiment.

Next, the trench 55 penetrating the source region (the first region) 18 and the p channel region (the third region) 16 and reaching the drift region (the second region) 14 is formed with dry etching using the mask material 62 as a mask (FIG. 21).

Figure 22:
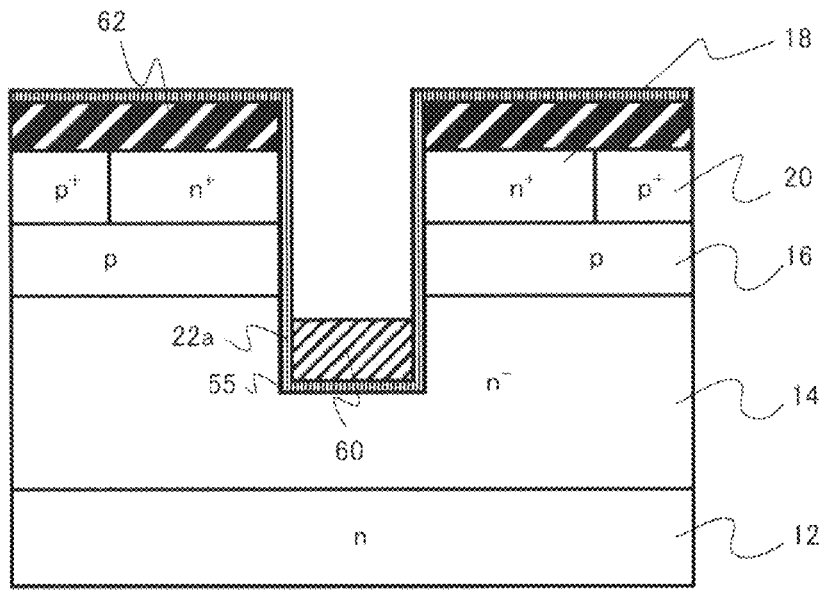
FIG. 22 is a schematic cross-sectional view illustrating the method of manufacturing the semiconductor device of the second embodiment.

Next, a first Si layer 22a is provided continuously on, the surface of the n-type source region (the first region) 18, on the surface of the n-type drift region (the second region) 14, and on the surface of the p-type p channel region (the third region) 16 and inside the trench 55. The first Si layer 22a is, for example, made of amorphous Si, and is formed, for example, with a Chemical Vapor Deposition (CVD) method. After that, a silicon oxide film is buried in the trench 55. After that, the silicon oxide film is etched back to form the buried oxide film 60 (FIG. 22).

Figure 23:
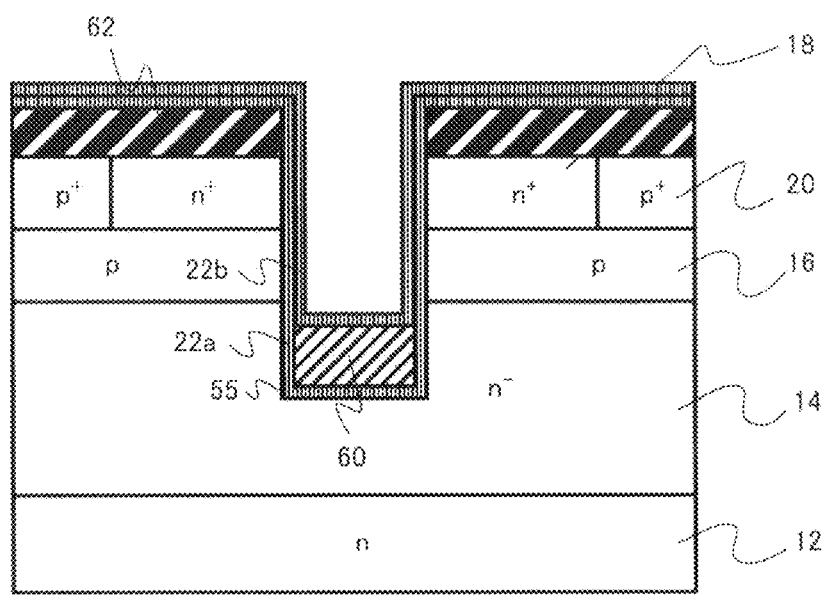
FIG. 23 is a schematic cross-sectional view illustrating the method of manufacturing the semiconductor device of the second embodiment.

After that a second Si layer 22b is formed on the first Si layer 22a (FIG. 23). The second Si layer 22b is, for example, made of amorphous Si. The first and second amorphous Si layer 22a and 22b are converted, for example, into single-crystal Si or poly-crystal Si with an annealing treatment and are unified as a Si layer 22.

Figure 24:
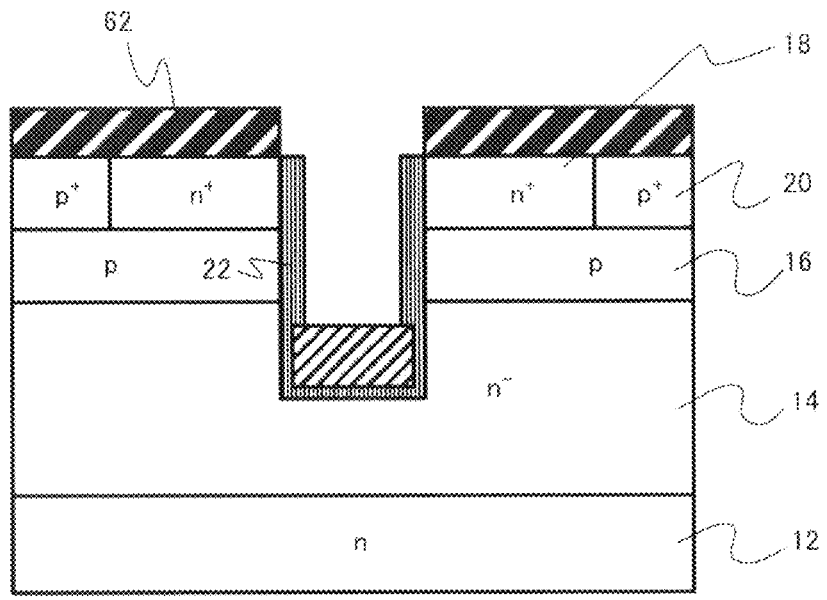
FIG. 24 is a schematic cross-sectional view illustrating the method of manufacturing the semiconductor device of the second embodiment.

Then, the Si layer 22 is etched back and is left only in the trench 55 (FIG. 24). Then, the mask material 62 is removed.

Figure 25:
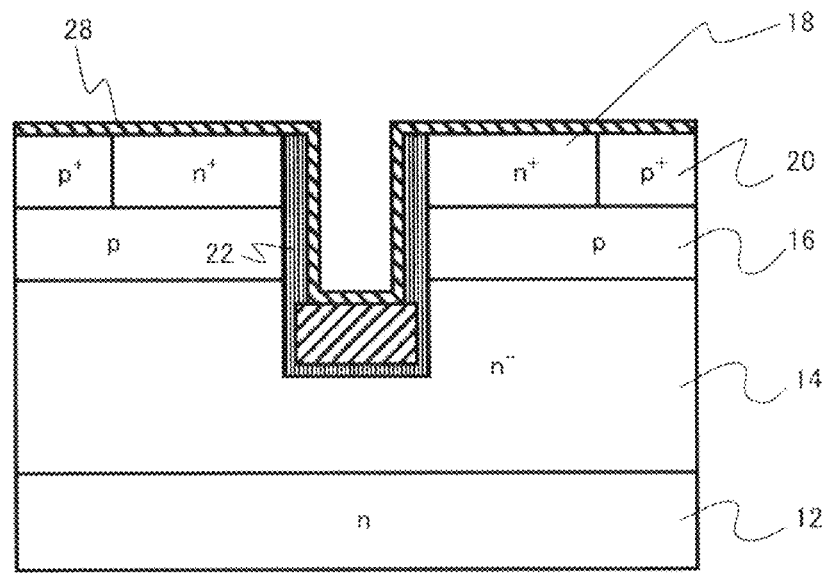
FIG. 25 is a schematic cross-sectional view illustrating the method of manufacturing the semiconductor device of the second embodiment.

Next, a gate insulating film 28 is formed on the surface of the Si layer 22 (FIG. 25). The gate insulating film 28 is, for example, a silicon oxide film formed with a CVD method.

Next, for example, a polysilicon gate electrode 30 is formed on the gate insulating film 28. Then, an interlayer insulator film 32, for example, that is a $SiO_2$ film is formed on the gate electrode 30.

After that, a conductive first electrode (source/p-well common electrode) 24 that is electrically connected to the source region 18 and the p channel contact region 20 is formed. The first electrode (the source/p-well common electrode) 24 is formed by Ni (nickel) and Al sputtering, for example. When the first electrode 24 is formed, the Si layer 22 can be removed in advance, for example, with etching. Alternatively, when the first electrode is formed by silicidation, the Si layer 22 can also be silicidated.

Next, a conductive second electrode (drain electrode) 36 is formed on the second face of the n⁻ SiC substrate 12. The second electrode (the drain electrode) 36 is formed by Ni sputtering, for example.

After that, to reduce the contact resistance of the first electrode 24 and second electrode 36, an annealing treatment is performed at a low temperature. The annealing is performed, for example, in an argon gas atmosphere of 400° C.

By the above described manufacturing method, the MOSFET 200 shown in FIG. 19 is formed.

This embodiment realizes a MOSFET with a low on-resistance by optimizing the thickness of the Si layer 22 for each region. The transistor is a trench-type transistor in this embodiment. This realizes a MOSFET in which a high current can flow.

In the embodiments, a 4H—SiC Si surface has been described as an example. However, the present disclosure can be developed in another surface orientation such as a C surface, an A surface, or an M surface. A 4H—SiC structure has been described as an example of the crystal structure of silicon carbide. However, the present disclosure can be applied to silicon carbide having another crystal structure such as a 6H—SiC structure, or a 3C—SiC structure.

In the embodiments, an n channel type transistor that uses an electron as the carrier has been described as an example. However, the present disclosure can be applied to a p channel transistor that uses a hole as the carrier. The present disclosure can also be applied to a device other than a MOSFET, for example, a vertical IGBT.

In the embodiments, an example in which Si is used as a channel has been described. However, instead of Si, a carbon material, for example, grapheme, nanotube, or diamond can be used.

While certain embodiments have been described, these embodiments have been presented by way of example only, and are not intended to limit the scope of the inventions. Indeed, the semiconductor device and the method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first region of a first conductivity type SiC;
   a second region of a first conductivity type SiC, impurity concentration of first conductivity type of the second region being lower than impurity concentration of first conductivity type of the first region;
   a third region of a second conductivity type SiC provided between the first region and the second region;
   a Si layer provided on surfaces of the first, second, and third regions, a thickness of the Si layer on the third region being thicker than a thickness of the Si layer on the second region;
   a gate insulating film provided on the Si layer; and
   a gate electrode provided on the gate insulating film.

2. The device according to claim 1, wherein at least a part of the Si layer on the second region has a thickness of 2 nm or less.

3. The device according to claim 1, wherein at least a part of the Si layer on the third region has a thickness of 5 nm or more.

4. The device according to claim 1, wherein an interface between the Si layer and the gate insulating film has an inclined portion approaching an interface between the third and second regions and the Si layer.

5. The device according to claim 1, wherein the Si layer is first conductivity type.

6. The device according to claim 1, wherein the Si layer has a part having a thickness of 10 nm or more on the third region.

7. The device according to claim 1, wherein the Si layer has a thickness of 100 nm or less on the third region.

8. The device according to claim 1, wherein the Si layer has a maximum thickness at a boundary portion between the first region and the third region.

9. The device according to claim 1, wherein a thickness of the gate insulating film on the second region is thicker than a thickness of the gate insulating film on the third region.

* * * * *